United States Patent
Borgmann et al.

(10) Patent No.: US 10,101,862 B2
(45) Date of Patent: Oct. 16, 2018

(54) METHOD FOR MEASURING A CAPACITANCE VALUE

(71) Applicant: Leopold Kostal GmbH & Co. KG, Luedenscheid (DE)

(72) Inventors: Uwe Borgmann, Recklinghausen (DE); Carl Christian Lexow, Dortmund (DE)

(73) Assignee: Leopold Kotsai GmbH & Co. KG, Luedenscheid (DE)

( * ) Notice: Subject to any disclaimer, the term of this patent is extended or adjusted under 35 U.S.C. 154(b) by 119 days.

(21) Appl. No.: 15/272,840

(22) Filed: Sep. 22, 2016

(65) Prior Publication Data

US 2017/0010721 A1    Jan. 12, 2017

Related U.S. Application Data

(63) Continuation of application No. PCT/EP2015/060474, filed on May 12, 2015.

(30) Foreign Application Priority Data

May 16, 2014    (DE) .................. 10 2014 007 236

(51) Int. Cl.
G06F 3/044    (2006.01)
H03K 17/96    (2006.01)
(Continued)

(52) U.S. Cl.
CPC ............ *G06F 3/044* (2013.01); *G06F 3/0416* (2013.01); *H03K 17/962* (2013.01);
(Continued)

(58) Field of Classification Search
CPC ..... G06F 3/044; G06F 3/0416; H03K 17/962; H03K 2217/960725; G01R 27/2605; G06K 2203/04108
See application file for complete search history.

(56) References Cited

U.S. PATENT DOCUMENTS 8,552,994 B2    10/2013    Simmons
9,304,156 B2    4/2016    Weingaertner et al.
(Continued)

FOREIGN PATENT DOCUMENTS

DE    29924441 U1    10/2003
DE    102010041464 A1    4/2011
(Continued)

OTHER PUBLICATIONS

The International Bureau of WIPO, International Preliminary Report on Patentability for International Application No. PCT/EP2015/060474, dated Dec. 1, 2016.
(Continued)

*Primary Examiner* — Christopher E Leiby
(74) *Attorney, Agent, or Firm* — Brooks Kushman P.C.

(57) ABSTRACT

A method for measuring a capacitance value of a capacitive sensor uses an integration process. For the integration process, the sensor is connected to an integration capacitor having a known capacitance value greater than the capacitance value of the sensor and a voltage $U_{CI}$ of the integration capacitor is measured by an A/D converter after a number IZ of executed integration cycles of the integration process. The method includes carrying out the integration process until the number IZ of executed integration cycles has reached the number N of integration cycles to be executed, adding a voltage value $U_{CI}(N)$ of the integration capacitor, which is determined by the A/D converter, to the total voltage value $U_{total}$, increasing the number N, and repeating until the number N exceeds a predetermined value. The final total voltage value $U_{total}$ is indicative of the capacitance value of the capacitive sensor.

6 Claims, 2 Drawing Sheets

(51) Int. Cl.
*G06F 3/041* (2006.01)
*G01R 27/26* (2006.01)
(52) U.S. Cl.
CPC .......... *G01R 27/2605* (2013.01); *G06F 2203/04108* (2013.01); *H03K 2217/960725* (2013.01)

(56) References Cited

U.S. PATENT DOCUMENTS

| | | | |
|---|---|---|---|
| 2009/0167720 A1* | 7/2009 | Geaghan | G01D 5/24 345/174 |
| 2010/0013502 A1* | 1/2010 | Kuang | G01R 27/2605 324/686 |
| 2010/0283485 A1 | 11/2010 | Vaelisuo et al. | |
| 2011/0073383 A1 | 3/2011 | Simmons | |
| 2011/0157067 A1* | 6/2011 | Wagner | G06F 3/0416 345/174 |
| 2011/0261006 A1* | 10/2011 | Joharapurkar | G06F 3/0416 345/174 |
| 2012/0218020 A1* | 8/2012 | Erdogan | G01R 27/2605 327/337 |
| 2013/0321006 A1 | 12/2013 | Weingaertner et al. | |
| 2014/0022203 A1* | 1/2014 | Karpin | G06F 19/00 345/174 |
| 2014/0039819 A1 | 2/2014 | Simmons | |
| 2014/0091815 A1 | 4/2014 | Suwald | |
| 2014/0285472 A1* | 9/2014 | Raynor | G06F 3/0416 345/175 |
| 2016/0378221 A1* | 12/2016 | Solven | G06K 9/00013 345/174 |

FOREIGN PATENT DOCUMENTS

| | | |
|---|---|---|
| DE | 102011010620 A1 | 8/2012 |
| EP | 2717136 A1 | 4/2014 |

OTHER PUBLICATIONS

European Patent Office, International Search Report for the corresponding International Application No. PCT/EP2015/060474 dated Jun. 18, 2015.

German Patent and Trademark Office, German Search Report for the corresponding German Patent Application No. DE 10 2014 007 236.3 dated Mar. 25, 2015.

* cited by examiner

METHOD FOR MEASURING A CAPACITANCE VALUE

CROSS-REFERENCE TO RELATED APPLICATIONS

This application is a continuation of International Application No. PCT/EP2015/060474, published in German, with an International filing date of May 12, 2015, which claims priority to DE 10 2014 007 236.3, filed May 16, 2014; the disclosures of which are hereby incorporated in their entirety by reference herein.

TECHNICAL FIELD

The present invention relates to a method for measuring a capacitance value $C_M$ of a capacitive sensor using an integration process in which a terminal of the sensor is electrically connected at a shared circuit node to a terminal of an integration capacitor having a known capacitance value $C_I$ greater than the capacitance value $C_M$ of the sensor with a voltage $U_{CI}$ present at the integration capacitor being measured by an A/D converter after a number IZ of executed integration cycles.

BACKGROUND

Methods of the type addressed here are used for evaluating capacitive touch or proximity sensors. Such a sensor can detect the presence of an object. Further, with an appropriate design, such as sensor can also detect a touch or the approach by an object, such as a finger or a user or a stylus, within a sensitive area. The touch-sensitive area may be overlaid on a display screen, for example. In one display application, the touch or proximity sensor may allow the user to directly interact with what is displayed on the screen. As such, the user is provided with more than just indirect interaction via a mouse or similar input device.

A number of different types of touch sensors exist. For example, touch sensor types include resistive touch sensors, touch sensors with acoustic surface waves, and capacitive touch sensors. Capacitive touch sensors, which may also be used in particular to detect mere proximity, have become the most widely used.

The value of the capacitance of a capacitive touch sensor changes when an object touches the surface of the sensor or comes into close proximity to the sensor. The task of an associated controller or of a measuring method used by the controller is to process (e.g., measure, detect, analyze) the change in capacitance of the sensor. The measuring method or controller processes the change in capacitance of the sensor in order to detect the triggering touch of the object on the sensor and/or the proximity of the object to the sensor.

A difficulty is that capacitances of capacitive touch sensors, and in particular capacitance changes to be detected, are typically relatively very small. For this reason, so-called integration (or acquisition) processes are often used for measuring the capacitance of a capacitance touch sensor. The integration processes involve transferring small charge quantities in multiple successive so-called integration (or acquisition) cycles from the capacitive touch sensor to an integration capacitor. The value of the capacitance of the capacitive touch sensor is relatively small and variable. The integration capacitor has a known fixed capacitance value. The known capacitance value of the integration capacitor is relatively much larger than the variable capacitance value of the capacitive touch sensor.

DE 10 2010 041 464 A1 (corresponding to U.S. Pat. No. 8,552,994) describes a method for measuring the capacitance value of a capacitive sensor. The measuring method involves an integration process of the type mentioned above. In this integration process a terminal of the capacitive sensor is electrically connected to a first terminal of an integration capacitor at a shared circuit node.

Various methods are used for carrying out the measurement. Thus, for example, after executing a preset number of integration cycles, a voltage is present at the integration capacitor. This voltage of the integration capacitor results from the sum of the charge transfers that have taken place during the integration cycles. After executing a preset number of the integration cycles, the voltage of the integration capacitor is measured and digitized by an A/D converter.

The measured voltage itself, or its digitized value, of the integration capacitor is used as the result of the measurement. Alternatively, a measured value of the capacitance of the capacitive sensor, which is computed from the voltage of the integration capacitor, the known constant capacitance of the integration capacitor, the value of the supply voltage, and/or the number of integration cycles, is used as the result of the measurement.

Alternatively, the voltage of the integration capacitor may be measured after each individual integration cycle. The measurement is ended upon the voltage of the integration capacitor reaching a predefined threshold value. In this case, the measured variable is the number of integration cycles that are executed until the integration capacitor voltage threshold value is reached.

The resolution of these measuring methods, and thus the limit for the distinguishability of two states or capacitance values, is determined essentially by the resolution of the A/D converter used in the integration process. The A/D converter can detect voltages only in specific discrete gradations. These stages are also referred to as quantization intervals. The area to be measured is thus quantized, i.e., divided into discrete regions. In this case, the area to be measured is quantized into voltage stages. During a measurement, the true voltage (i.e., the voltage measured by analog means) is associated with the value of the next higher or next lower stage as the digital measured value, depending on which of these stages is closest to the true voltage. The deviation of the true voltage from the voltage stage output by the A/D converter is the quantization error. Thus, references below to the voltage value measured by the A/D converter mean the digital value of the voltage stage output by the A/D converter.

SUMMARY

An embodiment provides a method for measuring a capacitance value $C_M$ of a capacitive (touch/proximity) sensor using an integration process. For the integration process, a terminal of the capacitive sensor is electrically connected at a shared circuit node to a first terminal of an integration capacitor. The integration capacitor has a known capacitance value $C_I$. The known capacitance value $C_I$ of the integration capacitor is greater than the capacitance value $C_M$ of the capacitive sensor. A voltage $U_{CI}$ is present at the integration capacitor after executing a preset number IZ of integration cycles. Each integration cycle involves transferring charge from the capacitance sensor to the integration capacitor. As such, the voltage $U_{CI}$ of the integration capacitor results from the sum of the charge transfers that have taken place during the preset number IZ of executed integration cycles. An A/D converter measures the voltage $U_{CI}$ of the integration capacitor after the preset number IZ of executed integration cycles.

In accordance with the embodiment, the method for measuring the capacitance value $C_M$ of the capacitive sensor using the integration process includes the following steps. A step (a) includes setting a number N of integration cycles to be executed to a start value $N_{start}$ and determining an end value $N_{end}$ for the number N of integration cycles to be executed. A step (b) includes initializing a total voltage value (i.e., a voltage sum value) $U_{total}$ to the value zero (i.e., null). A step (c) includes initializing the number IZ of executed integration cycles to the value zero. A step (d) includes carrying out the integration process until the number IZ of executed integration cycles has reached the number N of integration cycles to be executed. A step (e) includes adding the voltage value $U_{CI}$(N) present at the integration capacitor after the current iteration integration cycle is executed to the total voltage value $U_{total}$. The voltage value $U_{CI}$(N) of the integration capacitor is determined instantaneously by an A/D converter. A step (f) includes increasing the number N by a value n, where n is greater than or equal to one and is less than $N_{diff}=N_{end}-N_{start}$. The method further includes repeating steps (c), (d), (e), and (f), starting with step (c), until the number N exceeds the determined end value $N_{end}$. Subsequently, a step (g) includes evaluating (i.e., interpreting) the total voltage value $U_{total}$ as the measurement result to determine the capacitance value $C_M$ of the capacitive sensor.

The steps of the method for measuring the capacitance value of the capacitive sensor using the integration process has an advantage in that for a given resolution of the A/D converter a higher resolution of the measurement result may be achieved.

In an embodiment, the integration process in conjunction with the above set forth step (d) of the method for measuring the capacitance value $C_M$ of the capacitive sensor includes the following sub-steps. A sub-step (d1) includes connecting the shared circuit node and a second terminal of the integration capacitor to a ground potential GND. A sub-step (d2) includes applying a known supply voltage $U_V$ to the shared circuit node, while at the same time the second terminal of the integration capacitor is held voltage potential-free. A sub-step (d3) includes disconnecting the supply voltage $U_V$ from the shared circuit node, while at the same time the second terminal of the integration capacitor is connected to the ground potential GND. A sub-step (d4) includes increasing the number IZ of executed integration cycles by the value one and repeating the sub-steps, beginning with the sub-step (d2), until the number IZ of executed integration cycles has reached the predefined number N of integration cycles to be executed. A sub-step (d5) includes measuring the voltage $U_{CI}$(N) present at the integration capacitor by the A/D converter.

Another embodiment provides a method for measuring a capacitance value of a capacitive sensor using an integration process. For the integration process a terminal of the sensor is electrically connected at a shared circuit node to a first terminal of an integration capacitor having a known capacitance value greater than the capacitance value of the sensor and a voltage $U_{CI}$ of the integration capacitor is measured by an A/D converter after each integration cycle of the integration process is executed. The method includes the following steps. A step (a) includes initializing a total voltage value $U_{total}$ to a value zero. A step (b) includes initializing a number IZ of executed integration cycles to a value zero. A step (c) includes carrying out the integration process by executing an integration cycle. A step (d) includes adding a voltage value $U_{CI}$(N) of the integration capacitor after the integration cycle has been executed, which is determined by the A/D converter, to the total voltage value $U_{total}$. A step (e) includes increasing the number IZ of executed integration cycles by one. A step (f) includes repeating steps (c), (d), and (e), beginning with step (c), until the total voltage value $U_{total}$ reaches a predefined voltage value. A step (g) includes evaluating the number IZ of executed integration cycles as a measurement result indicative of the capacitance value of the capacitive sensor.

BRIEF DESCRIPTION OF THE DRAWINGS

Functional principles and exemplary embodiments are explained in greater detail below with reference to the drawings, which show the following.

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1A:
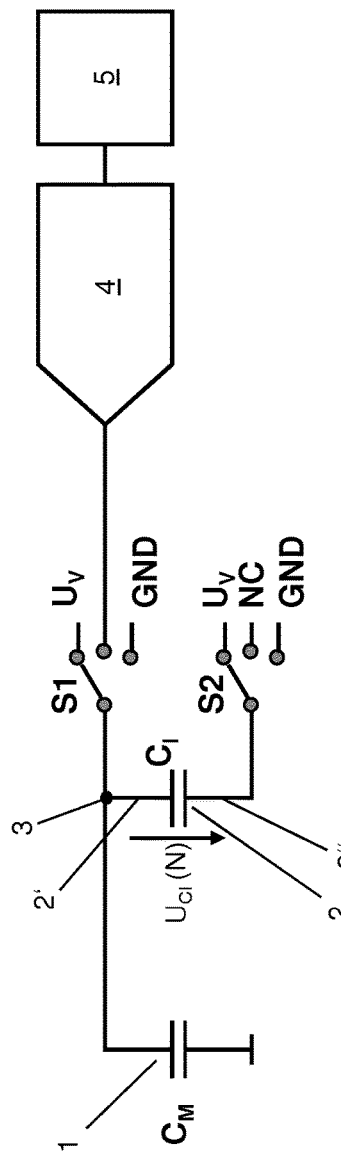
FIG. 1A illustrates a schematic circuit diagram of a measuring arrangement for carrying out a method for measuring the capacitance value $C_M$ of a capacitive touch sensor using an integration process.

Referring now to FIG. 1A, a schematic circuit diagram of a measuring arrangement for carrying out a method for measuring the capacitance value $C_M$ of a capacitive touch sensor 1 using an integration (acquisition) process is shown. Sensor 1 forms a touch/proximity sensor, for example, in the form of an electrode. Sensor 1 has, for example, a self-capacitance with a capacitance value $C_M$ with respect to a relative ground or earth potential. When sensor 1 is touched or approached, such as by a finger of a user, the capacitance value $C_M$ of sensor 1 changes due to the touch capacitance thereof with respect to the ground or earth potential.

A terminal of sensor 1 is electrically connected at a shared circuit node 3 to a first terminal 2' of an integration capacitor 2. Integration capacitor 2 has a known capacitance value $C_I$. Known capacitance value $C_I$ of integration capacitor 2 is larger than capacitance value $C_M$ of sensor 1 that is to be determined. Shared circuit node 3 is also connected to a first switch S1. Via first switch S1, shared circuit node 3 is selectively connectable to the ground or earth potential GND, a fixed supply voltage $U_V$, or an input of an A/D converter 4 depending on the switch setting of first switch S1. A second terminal 2" of integration capacitor 2 is electrically connected to a second switch S2. Via second switch S2, second terminal 2" of integration capacitor 2 is selectively connectable to the ground or earth potential GND, the fixed supply voltage $U_V$, or is held voltage potential-free, i.e., held open (NC), depending on the switch setting of second switch S2.

The method for measuring the capacitance value $C_M$ of sensor 1 employs an integration (acquisition) process. The integration process involves transferring small charge quantities in multiple successive integration cycles from sensor 1 to integration capacitor 2. Each integration cycle involves transferring charge from sensor 1 to integration capacitor 2. As such, after a number N of these charge transfers, referred to as the integration cycles, a voltage $U_{CI}$ (N) is present at integration capacitor 2. The voltage $U_{CI}$ (N) of integration capacitor 2 results from the sum of the charge transfers that have taken place during the number N of executed integration cycles.

An A/D converter 4 measures the voltage $U_{CI}$ (N) of integration capacitor 2. The voltage $U_{CI}$ (N) of integration capacitor 2 is directly proportional to the capacitance value $C_M$ of sensor 1. Thus, the voltage $U_{CI}$ (N) of integration capacitor 2 is a measure of the capacitance value $C_M$ of sensor 1.

Figure 1B:
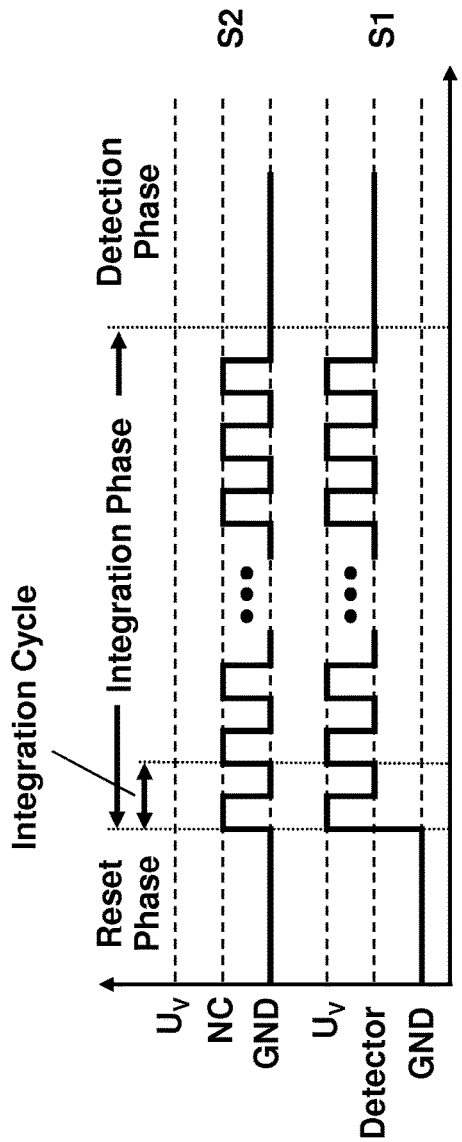
FIG. 1B illustrates a sequence of the integration process having N integration cycles being depicted in accordance with a timing diagram of the switches of the measuring arrangement shown in FIG. 1A.

Referring now to FIG. 1B, with continual reference to FIG. 1A, a sequence of the integration process having N integration cycles is depicted in accordance with a timing diagram of switches S1 and S2 of the measuring arrangement. The sequence of the integration process is an exemplary sequence described by way of example with reference to the timing diagram of switches S1 and S2 of the measuring arrangement.

To initialize the measuring operation for measuring the capacitance value $C_M$ of sensor 1 using the integration process, shared circuit node 3, which is connected to first terminal 2' of integration capacitor 2, and second terminal 2" of integration capacitor 2 are both connected to the ground potential. This consequently sets the voltage $U_{CI}$ (0) of integration capacitor 2 to zero (i.e., null). This corresponds to the "Reset Phase" shown in FIG. 1B.

The following steps describe each integration cycle.

The supply voltage $U_V$ is applied to shared circuit node 3 by switch S1, while at the same time second terminal 2" of integration capacitor 2 is held open, and thus potential-free, by second switch S2. This corresponds to the first portion of each "Integration Cycle" shown in FIG. 1B. Supply voltage $U_V$ is then disconnected from shared circuit node 3 by first switch S1 and held potential-free, while at the same time second terminal 2" of integration capacitor 2 is connected to ground potential GND by second switch S2. This corresponds to the second portion of each "Integration Cycle" of the "Integration Phase" shown in FIG. 1B.

In the course of a measurement, the steps of this integration cycle are repeated. In particular, the steps of this integration cycle are repeated often enough until the executed number IZ of integration cycles has reached a predefined number N. The repeating of the integration cycles until the executed number IZ of integration cycles has reached a predefined number N corresponds to the "Integration Phase" shown in FIG. 1B.

The voltage $U_{CI}$ (N) of integration capacitor 2 after these N integration cycles is subsequently measured by A/D converter 4. Shared circuit node 3 is connected to the input of A/D converter 4 by first switch S1 for A/D converter 4 to measure the voltage $U_{CI}$ (N) of integration capacitor 2. This corresponds to the "Detection Phase" shown in FIG. 1B.

A/D converter 4 transmits the measured (digital) voltage value $U_{CI}$ (N) of integration capacitor 2 to a control and evaluation device 5 of the measuring arrangement. Control and evaluation device 5 processes and evaluates the measured (digital) voltage value $U_{CI}$ (N) of integration capacitor 2 to measure the capacitance value $C_M$ of sensor 1. As indicated, the voltage $U_{CI}$ (N) of integration capacitor 2 is directly proportional to the capacitance value $C_M$ of sensor 1. Thus, the voltage $U_{CI}$ (N) of integration capacitor 2 is a measure of the capacitance value $C_M$ of sensor 1.

Control and evaluation device 5 controls and manages the entire method for measuring the capacitance value $C_M$ of sensor 1. For this purpose, control and evaluation device 5 includes a microcontroller, for example, as a key component.

Figure 2:
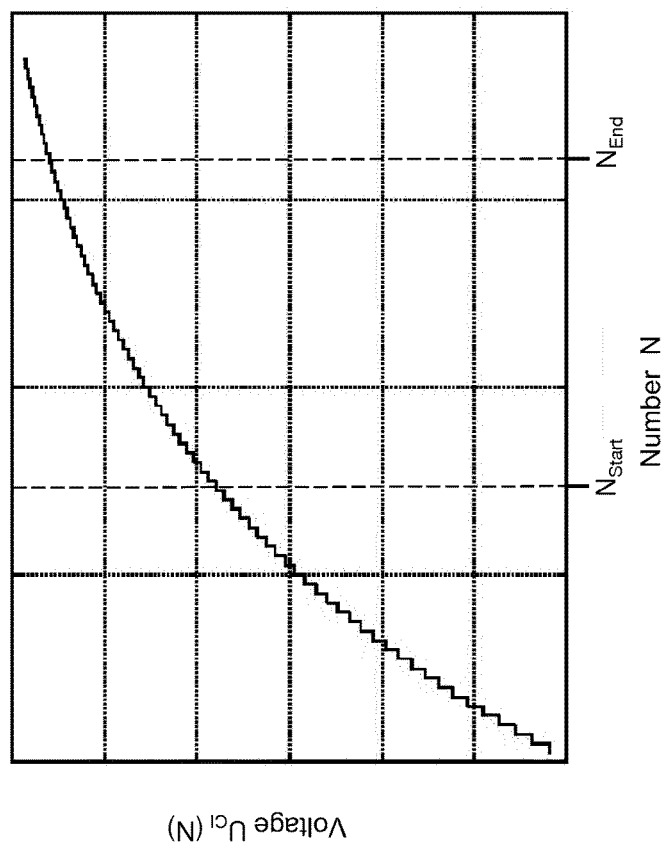
FIG. 2 illustrates a plot of the voltage $U_{CI}$(N) of the integration capacitor as a function of the number N of integration cycles.

In accordance with the present invention, the above-described measurement using N integration cycles is a component of a higher-level process. The higher-level process includes multiple such measurements, each with different values of the number N of integration cycles to be executed. In accordance with the present invention, the integration cycles are conducted in the following manner described below. The successive manner in which the integration cycles are conducted is also apparent from the illustration of the plot of the voltage $U_{CI}$ (N) of integration capacitor 2 as a function of the number N of integration cycles shown in FIG. 2.

In operation, the number N of integration cycles to be executed is initially set to a start value $N_{start}$ for the first measurement within the scope of the higher-level process. At the same time, a target or end value $N_{end}$ for the maximum number N of integration cycles to be executed is determined for the most recent measurement within the scope of the higher-level process. A total voltage value $U_{total}$ is initialized to the value zero.

The number IZ of executed integration cycles is initialized to the value zero at the start. The integration process described above is subsequently carried out until the number IZ of executed integration cycles, which is increased by the value one for each execution, has reached the instantaneously valid number N of integration cycles to be executed. The voltage value $U_{CI}$ (N) present at integration capacitor 2 is subsequently determined by A/D converter 4. This voltage value is added to the instantaneously valid total voltage value $U_{total}$.

The number N of integration cycles to be executed is subsequently increased by a value n. The steps are repeated each time with the new number N. The increment value n is at least equal to 1 and is less than the difference $N_{diff}=N_{end}-N_{start}$ between the start value $N_{start}$ and the target or end value $N_{end}$. To avoid obtaining an insufficient quantity of measurements, each with N integration cycles, as a component of the higher-level process, the increment value n is generally selected to be much smaller than $N_{diff}$. The increment value n may either vary from step to step, or may assume a constant value of n=1, n=3, or n=4, for example. The steps are repeated often enough with the new number N until the number N exceeds the initially determined end value $N_{end}$.

The cumulative total voltage value $U_{total}$ added up to this point in time is then evaluated as the measurement result. This measurement result is indicative of the capacitance value $C_M$ of sensor 1.

The individual measured voltage values $U_{CI}$ (N) are entered as summands into the total voltage value $U_{total}$. Each of these voltage values $U_{CI}$ (N) has been determined by A/D converter 4. Therefore, as already described above, each of these determined voltage values $U_{CI}$ (N) contains a quantization error. The quantization runs linearly over the measuring range; i.e., the level of the voltage stages that are output by A/D converter 4 is equal in each case. However, since the plot of the voltage $U_{CI}$ (N) of integration capacitor 2, as a function of the number N of integration cycles, is nonlinear (as is apparent from FIG. 2), a statistical distribution of the quantization error is present which results overall in an at least partial compensation for the quantization error.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A method for measuring a capacitance value of a capacitive sensor using an integration process, wherein for the integration process a terminal of the capacitive sensor is electrically connected at a shared circuit node to a first terminal of an integration capacitor having a known capacitance value greater than the capacitance value of the capacitive sensor and a voltage $U_{CI}$ of the integration capacitor is measured by an A/D converter after a number IZ of executed integration cycles of the integration process in which each integration cycle involves applying voltages to the shared circuit node to cause charge transfer from the capacitive sensor to the integration capacitor, the method comprising:
   (a) setting a number N of integration cycles to be executed to a start value $N_{start}$ and determining an end value $N_{end}$ for the number N of integration cycles to be executed;
   (b) initializing a total voltage value $U_{total}$ to a value zero;
   (c) initializing a number IZ of executed integration cycles to a value zero;
   (d) carrying out the integration process until the number IZ of executed integration cycles has reached the number N of integration cycles to be executed;
   (e) adding a voltage value $U_{CI}$ (N) of the integration capacitor, which is determined by the A/D converter, to the total voltage value $U_{total}$;
   (f) increasing the number N by a value n, wherein n is an integer greater than or equal to one and is less than $N_{diff}=N_{end}-N_{start}$, and repeating steps (c), (d), (e), and (f), beginning with step (c), until the number N exceeds the determined end value $N_{end}$; and
   (g) evaluating the total voltage value $U_{total}$ as a measurement result indicative of the capacitance value of the capacitive sensor.

2. The method of claim 1 wherein:
the value n is a constant value.

3. The method of claim 1 wherein:
the value n varies from step to step.

4. The method of claim 1 wherein:
the step (d) includes the following sub-steps:
   (d1) connecting the shared circuit node and the second terminal of the integration capacitor to a ground potential;
   (d2) applying a known supply voltage to the shared circuit node, while at the same time the second terminal of the integration capacitor is held voltage potential-free;
   (d3) disconnecting the supply voltage from the shared circuit node, while at the same time the second terminal of the integration capacitor is connected to the ground potential;
   (d4) increasing the number IZ of executed integration cycles by the value one and repeating the sub-steps (d2), (d3), and (d4), beginning with sub-step (d2), until the number IZ of executed integration cycles has reached the predefined number N of integration cycles to be executed; and
   (d5) measuring the voltage $U_{CI}$ (N) of the integration capacitor by the A/D converter.

5. A system for measuring a capacitance value of a capacitive sensor using an integration process, wherein for the integration process a terminal of the capacitive sensor is electrically connected at a shared circuit node to a first terminal of an integration capacitor having a known capacitance value greater than the capacitance value of the capacitive sensor and a voltage $U_{CI}$ of the integration capacitor is measured by an A/D converter after a number IZ of executed integration cycles of the integration process in which each integration cycle involves applying voltages to the shared circuit node to cause charge transfer from the capacitive sensor to the integration capacitor, the system comprising:
   a controller configured to:
   (a) set a number N of integration cycles to be executed to a start value $N_{start}$ and determine an end value $N_{end}$ for the number N of integration cycles to be executed;
   (b) initialize a total voltage value $U_{total}$ to a value zero;
   (c) initialize a number IZ of executed integration cycles to a value zero;
   (d) carry out the integration process until the number IZ of executed integration cycles has reached the number N of integration cycles to be executed;
   (e) add a voltage value $U_{CI}$ (N) of the integration capacitor, which is determined by the A/D converter, to the total voltage value $U_{total}$;
   (f) increase the number N by a value n, wherein n is an integer greater than or equal to one and is less than $N_{diff}=N_{end}-N_{start}$, and repeating steps (c), (d), (e), and (f), beginning with step (c), until the number N exceeds the determined end value $N_{end}$; and
   (g) evaluate the total voltage value $U_{total}$ as a measurement result indicative of the capacitance value of the capacitive sensor.

6. The system of claim 5 wherein:
the controller is further configured to:
   (d1) connect the shared circuit node and the second terminal of the integration capacitor to a ground potential;
   (d2) apply a known supply voltage to the shared circuit node, while at the same time the second terminal of the integration capacitor is held voltage potential-free;
   (d3) disconnect the supply voltage from the shared circuit node, while at the same time the second terminal of the integration capacitor is connected to the ground potential; and
   (d4) increase the number IZ of executed integration cycles by the value one and repeating the sub-steps (d2), (d3), and (d4), beginning with sub-step (d2), until the number IZ of executed integration cycles has reached the predefined number N of integration cycles to be executed.

* * * * *